United States Patent
Nietfeld

(10) Patent No.: US 11,184,966 B2
(45) Date of Patent: Nov. 23, 2021

(54) METHOD AND MEANS FOR SETTING A CURRENT SOURCE FOR A LIGHT-EMITTING DIODE ARRAY

(71) Applicant: HELLA GmbH & Co. KGaA, Lippstadt (DE)

(72) Inventor: Dieter Nietfeld, Paderborn (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 17/166,803

(22) Filed: Feb. 3, 2021

(65) Prior Publication Data
US 2021/0160987 A1 May 27, 2021

Related U.S. Application Data

(63) Continuation of application No. PCT/EP2019/069826, filed on Jul. 23, 2019.

(30) Foreign Application Priority Data

Aug. 3, 2018 (DE) ...................... 10 2018 118 876.5

(51) Int. Cl.
*H05B 45/46* (2020.01)
*H05B 45/395* (2020.01)
(Continued)

(52) U.S. Cl.
CPC ............. *H05B 45/46* (2020.01); *G11C 19/28* (2013.01); *H05B 45/3725* (2020.01); *H05B 45/395* (2020.01)

(58) Field of Classification Search
CPC .. H05B 45/46; H05B 45/395; H05B 45/3725; H05B 47/155; G11C 19/28; F21S 41/153; B60Q 1/2607
See application file for complete search history.

(56) References Cited

U.S. PATENT DOCUMENTS 8,310,167 B2 11/2012 Ellman et al.
8,487,554 B2 * 7/2013 Sauerlaender ......... H05B 45/44
315/308

(Continued)

FOREIGN PATENT DOCUMENTS

DE 10061370 A1 6/2002
DE 102008060042 A1 9/2009
(Continued)

OTHER PUBLICATIONS

International Search Report dated Dec. 3, 2019 in corresponding application PCT/EP2019/069826.

*Primary Examiner* — Minh D A
(74) *Attorney, Agent, or Firm* — Muncy, Geissler, Olds & Lowe, P.C.

(57) ABSTRACT

An arrangement including a light-emitting diode array made up of light-emitting diodes, each light-emitting diode being switchable on and off with the aid of a controllable switch, and including a current source for supplying the light-emitting diode array with current. The arrangement including an interface, to which an input signal having image information for an image, which is displayable with the aid of the light-emitting diode array, may be applied, and the interface converting the input signal into digital signals in which information is contained for switching the controllable switches on and off. The arrangement including a counter, with the aid of which it is possible to detect how many switches are closed or are to be closed within a clock pulse. The current supplied by the current source is controllable as a function of the counter reading.

14 Claims, 1 Drawing Sheet

(51) Int. Cl.
*H05B 45/3725* (2020.01)
*G11C 19/28* (2006.01)

(56) References Cited

U.S. PATENT DOCUMENTS 9,158,316 B2 * 10/2015 Theiler ................ G09G 3/3406
2010/0045190 A1 * 2/2010 Cramer ................ H05B 45/12
　　　　　　　　　　　　　　　　　　　315/151

FOREIGN PATENT DOCUMENTS

| DE | 102010060857 A1 | 5/2012 |
| DE | 102010054899 A1 | 6/2012 |
| EP | 2271180 A1 | 1/2011 |
| EP | 2744302 A1 | 6/2014 |
| WO | WO2010013177 A1 | 2/2010 |

* cited by examiner

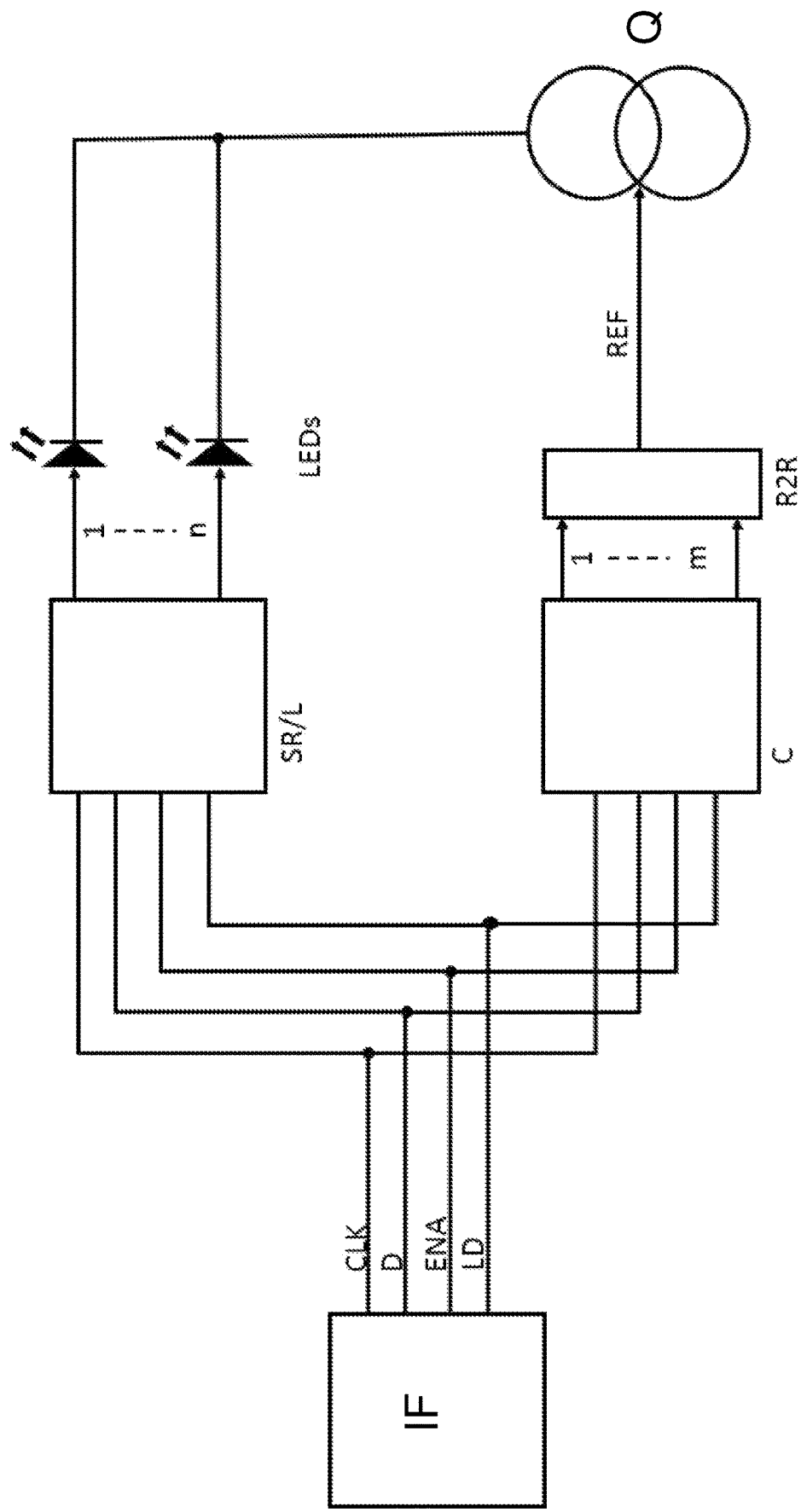

METHOD AND MEANS FOR SETTING A CURRENT SOURCE FOR A LIGHT-EMITTING DIODE ARRAY

This nonprovisional application is a continuation of International Application No. PCT/EP2019/069826, which was filed on Jul. 23, 2019 and which claims priority to German Patent Application No. DE 10 2018 118 876.5, which was filed in Germany on Aug. 3, 2018 and which are both herein incorporated by reference.

BACKGROUND OF THE INVENTION

Field of the Invention

The present invention relates to a method and a means for setting a current source for a light-emitting diode array.

Description of the Background Art

A method and means for setting a current source for supplying a light-emitting diode array are known from the document DE 10 2010 060 857 A1. A light-emitting diode array, which was supplied with electrical energy with the aid of the power supply specified in the document DE 10 2010 060 857 A1, usually had a number of up to 20 light-emitting diodes, which had, in part, different forward voltages, which resulted in differences in the brightness of the light-emitting diodes with the same current. To obtain a homogeneous appearance of the light-emitting diode array, however, it is important that all light-emitting diodes of the light-emitting diode array leave a uniform brightness impression with a viewer. To achieve this goal, a PWM is used. With the aid of this PWM, switches are switched on and off in series with respect to the LEDs, so that the average brightness of the light-emitting diodes is uniform. As a result of the PWM control of the brightness of the light-emitting diodes, the current needed by the light-emitting diode array to achieve the desired brightness fluctuates. A current source for supplying the light-emitting diode array must therefore be continuously set depending on the switched-on light-emitting diodes.

Light-emitting diode arrays having significantly more light-emitting diodes are used in more recent applications. Light-emitting diode arrays having more than one thousand light-emitting diodes are thus no longer a rarity. At such a high number of light-emitting diodes, the influence of an individual light-emitting diode on the brightness impression of the light-emitting diode array is of lesser importance. A complex PWM control of the brightness of each individual light-emitting diode may therefore be dispensed with. The uniform brightness impression is ensured by the large number of light-emitting diodes.

If the light-emitting diode arrays are operated in a rear area of a motor vehicle, this is possible using lower currents than if they are used in the front area. Light-emitting diodes which are operated at lower currents have a much higher differential resistance. Due to this higher differential resistance, differences in the forward voltages of the light-emitting diodes of a light-emitting diode array of this type also have significantly less effect than do light-emitting diodes which are operated with higher currents of, for example, 3 A.

The light-emitting diode arrays known today in motor vehicles are therefore used not only to provide a lamp having one function. It is quite common for the light-emitting diode arrays to be part of so-called combination lamps, which carry out multiple lighting functions in a motor vehicle. For the different functions of a light-emitting diode array, for example as a position lamp, turn indicator, brake light, rear fog lamp, or the like, it is common to switch light-emitting diodes of the light-emitting diode array on and off individually. Symbols may thus also be represented with the aid of the light-emitting diode array.

In the case of the newer, larger light-emitting diode arrays, it is thus also still necessary, in principle, to be able to switch light-emitting diodes on and off individually. As a result, it is also sensible in the case of the newer, larger light-emitting diode arrays to be able to set the current for supplying the light-emitting diode array, which then results in the necessary brightness of the light-emitting diode array.

SUMMARY OF THE INVENTION

It is therefore an object of the present invention to provide a simple method for setting a current source for supplying a light-emitting diode array.

This object is achieved according to the invention in that the arrangement includes an interface, to which an input signal having image information for an image, which is displayable with the aid of the light-emitting diode array, may be applied, and the interface converts the input signal into digital signals, in which information is contained for switching the controllable switches on and off; and the arrangement includes a counter, with the aid of which it is possible to detect how many switches are closed or are to be closed within a clock pulse; and the current supplied by the current source is controllable as a function of the counter reading.

The input signal including image information specifies which light-emitting diode of the light-emitting diode array is to be switched on or off. The image contained in this information may specify that all or only a part of the light-emitting diodes are to be switched on. If only a part of the light-emitting diodes of the light-emitting diode array is to be switched on, these light-emitting diodes may be provided in a contiguous area of the light-emitting diode array. However, it is also possible that the image information specifies that a pattern is displayed by the light-emitting diode array, and light-emitting diodes specially selected for this purpose are switched on.

The input signal could be a video signal, for example an RGB signal or a monochrome signal. The interface may thus be a video interface. However, it is also possible that the interface is an SPI (serial peripheral interface).

The counter may be a digital counter, which provides a counter reading digitally.

A register is preferably connected downstream from the counter, to which the counter reading may be transmitted and from which the counter reading may be retrieved. The counter reading may remain available in the register for retrieval until the content of the register is overwritten. The counter may be reset after a transmission of the counter reading to the register and be available for a new counting operation.

An arrangement according to the invention may include a digital-analog converter to convert the counter reading into an analog signal for controlling the current source. For this purpose, the digital-analog converter may be connected to the counter or to the register connected downstream from the counter.

An arrangement according to the invention preferably includes a component for setting the switches. The component for setting the switches may include a first register, into which the switching states of the switches may be entered. The first register may be connected indirectly or directly to the control inputs of the controllable switches. The switches may be switched on or off thereby according to the register contents, or they may retain their state.

The component for setting the switches preferably includes a second register, which is connected to the interface and the first register.

The digital signals of the interface may include a switch-on and switch-off signal, in which the switching states of the light-emitting diodes are indicated, which are to be assumed by the light-emitting diodes.

The digital signals of the interface may comprise a clock signal specifying a clock pulse.

The switching states to be assumed by the switches may be consecutively or serially transmitted in the switch-on and switch-off signal.

The counter may be incremented or decremented from an output value, if the switch-on and switch-off signal indicates the "switched on" switching state or the "switched off" switching state of a light-emitting diode.

The counter may be only incremented or decremented from an output value, if the switch-on and switch-off signal indicates the switching state "switched on" or the switching state "switched off" of a light-emitting diode.

The second register of the component for setting the switches may be a shift register, to which the switching states to be assumed by the switches may be consecutively or serially transmitted from the switch-on and switch-off signal to the shift register.

The digital signals may comprise a transfer signal, in the presence of which the instantaneous counter reading is transmittable to the register of the counter and/or in the presence of which the contents of the second register are to be transmitted to the first register.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given hereinbelow and the accompanying drawing which are given by way of illustration only, and thus, are not limitive of the present invention, and wherein the sole FIGURE shows a schematic representation of an arrangement according to the invention.

DETAILED DESCRIPTION

The arrangement according to the invention is used to drive light-emitting diodes LEDs of a light-emitting diode array.

The arrangement according to the invention illustrated in the FIGURE includes an interface, to which an input signal containing image information may be applied. The interface converts the input signal into digital signals, which comprise a switch-on and switch-off signal D, a transfer signal LD and a clock signal CLK. An activation and deactivation signal ENA may also be provided, which however, does not have any particular significance for the example.

The digital signals are supplied to a component for setting switches SR/L, which includes a first register and a second register, which is a shift register. The switching states coded in switch-on and switch-off signal D, which light-emitting diodes LEDs are to assume, are entered consecutively into the shift register.

Once they are displayed in transfer signal LD, the contents of the shift register are transmitted to the first register. The first register is connected to control inputs of controllable switches of the light-emitting diode array, with the aid of which light-emitting diodes LEDs may switched on or off individually. The data word provided in the first register then corresponds to the switching state of the light-emitting diodes.

Switch-on and switch-off signal D, including the switching states coded therein, is also transmitted serially to the counter. The counter is incremented from an initial value, preferably zero, once a switch-on signal is transmitted. When transfer signal LD indicates that the contents of the shift register are to be transmitted to the first register, the counter reading of the counter is transmitted to a register connected downstream from the counter, and the counter is reset to the initial value. The transmitted counter reading is then available in the register for retrieval.

The register connected downstream from the counter is connected to digital-analog converter R2R. The latter converts the digital counter reading into an analog signal, which corresponds to the counter reading. This analog signal is supplied to a current source as a reference variable REF, and the current sources is regulated in such a way that it sets the current specified by the reference variable for the purpose of supplying current to light-emitting diodes LEDs of the light-emitting diode array connected to the current source.

In this arrangement according to the invention, it is ensured that the current source continuously supplies the current needed for the proper operation of the light-emitting diodes of the light-emitting diode array.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An arrangement comprising:
   a light-emitting diode array made up of light-emitting diodes being switchable on and off with the aid of a controllable switch;
   a current source for supplying the light-emitting diode array with current;
   an interface, to which an input signal having image information for an image, which is displayable with the aid of the light-emitting diode array, is adapted to be applied, the interface converting the input signal into digital signals in which information is contained for switching the controllable switches on and off; and
   a counter with the aid of which it is possible to detect how many switches are closed or are to be closed within a clock pulse,
   wherein the current supplied by the current source is controllable as a function of the counter reading.

2. The arrangement according to in claim 1, wherein that the counter is a digital counter, which provides a counter reading digitally.

3. The arrangement according to in claim 2, wherein a register is connected to the counter, to which the counter reading may be transmitted and from which the counter reading may be retrieved.

4. The arrangement according to claim 3, wherein the digital signals comprise a transfer signal, in the presence of which the instantaneous counter reading is transmittable to the register of the counter and/or in the presence of which the contents of the second register are to be transmitted to the first register.

5. The arrangement according to in claim 1, wherein the arrangement includes a digital-analog converter for converting the counter reading into an analog signal for controlling the current source.

6. The arrangement according to in claim 1, wherein the arrangement includes a component for setting the switches.

7. The arrangement according to in claim 6, wherein the component for setting the switches includes a first register, into which the switching states of the switches is entered.

8. The arrangement according to in claim 7, wherein the first register is connected indirectly or directly to the control inputs of the controllable switches.

9. The arrangement according to in claim 6, wherein the component for setting the switches includes a second register, which is connected to the interface and the first register.

10. The arrangement according to in claim 1, wherein the digital signals of the interface include a switch-on and switch-off signal, the switching states of the light-emitting diodes being indicated, which are to be assumed by the light-emitting diodes.

11. The arrangement according to in claim 1, wherein the digital signals of the interface include a clock signal specifying a clock pulse.

12. The arrangement according to in claim 11, wherein the switching states to be assumed by the switches are transmittable consecutively in the switch-on and switch-off signal.

13. The arrangement according to in claim 12, wherein the counter is incremented or decremented from an initial value if the switch-on and switch-off signal indicates the switching state "switched on" or the switching state "switched off" of a light-emitting diode, or is only incremented if the switch-on and switch-off signal indicates the switching state "switched on" or decremented if the switch-on and switch-off signal indicates the switching state "switched off."

14. The arrangement according to in claim 12, wherein the second register of the component for setting the switches is a shift register, to which the switching states to be assumed by the switches are transmitted consecutively from the switch-on and switch-off signal to the shift register.

\* \* \* \* \*